US012749532B2

(12) United States Patent
Manfré et al.

(10) Patent No.: US 12,749,532 B2
(45) Date of Patent: Sep. 29, 2026

(54) NON-VOLATILE MEMORY HAVING FIRST AND SECOND LEDAY CIRCUITS, AND ELECTRONIC SYSTEM AND METHOD

(71) Applicant: STMicroelectronics International N.V., Geneva (CH)

(72) Inventors: Davide Manfré, Pandino (IT); Maurizio Francesco Perroni, Messina (IT); Massimo Caruso, Messina (IT); Fabio Enrico Carlo Disegni, Spino d'adda (IT); Cesare Torti, Pavia (IT)

(73) Assignee: STMicroelectronics International N.V., Geneva (CH)

( * ) Notice: Subject to any disclaimer, the term of this patent is extended or adjusted under 35 U.S.C. 154(b) by 125 days.

(21) Appl. No.: 18/817,969

(22) Filed: Aug. 28, 2024

(65) Prior Publication Data

US 2025/0078926 A1 Mar. 6, 2025

(30) Foreign Application Priority Data

Aug. 29, 2023 (IT) ........................ 102023000017769

(51) Int. Cl.
*G11C 11/00* (2006.01)
*G11C 13/00* (2006.01)

(52) U.S. Cl.
CPC ...... *G11C 13/0069* (2013.01); *G11C 13/0028* (2013.01); *G11C 13/0061* (2013.01)

(58) Field of Classification Search
CPC ............ G11C 13/0069; G11C 13/0028; G11C 13/0061; G11C 11/1657; G11C 16/08; G11C 8/08
USPC .......................................................... 365/148
See application file for complete search history.

(56) References Cited

U.S. PATENT DOCUMENTS 5,737,275 A * 4/1998 Matthews ................ G11C 8/08 365/230.06
8,068,381 B2 * 11/2011 Chung ..................... G11C 8/08 365/230.06
2010/0110767 A1 * 5/2010 Katoh ................ G11C 13/0028 365/226
2012/0007662 A1 1/2012 Jang
(Continued)

OTHER PUBLICATIONS

Stmicroelectronics N.V., "Written Opinion and Search Report", Italian Application No. 202300017769, dated May 8, 2024, 7 pages.

*Primary Examiner* — Tha-O H Bui
(74) *Attorney, Agent, or Firm* — Slater Matsil, LLP

(57) ABSTRACT

A non-volatile memory includes a row decoder including, for each word-line, a respective pull-up connected to a first supply voltage and a switching circuit for selectively connecting one of the word-lines to ground. The row decoder includes a demultiplexer connected to a second supply voltage smaller than the first, and configured to assert an enable signal as a function of an address signal. The switching circuit includes two n-channel FETs connected in series between the word-line and ground, with the gate terminal of one FET connected to a first signal and the gate terminal of the other FET connected to a second voltage. A bias circuit is configured to set the voltage between the two FETs to the second voltage when the FETs are opened. The switching circuit includes a p-channel FET connected between the word-line and the second voltage, and a gate terminal connected to a second signal.

20 Claims, 7 Drawing Sheets

(56) References Cited

U.S. PATENT DOCUMENTS

| | | | |
|---|---|---|---|
| 2018/0151223 | A1 | 5/2018 | Torti et al. |
| 2019/0096480 | A1 | 3/2019 | Conte |
| 2019/0140175 | A1 | 5/2019 | Hinsinger |
| 2019/0140176 | A1 | 5/2019 | Arnaud et al. |
| 2021/0012836 | A1 | 1/2021 | La Placa et al. |

* cited by examiner

NON-VOLATILE MEMORY HAVING FIRST AND SECOND LEDAY CIRCUITS, AND ELECTRONIC SYSTEM AND METHOD

CROSS-REFERENCE TO RELATED APPLICATIONS

This application claims the benefit of Italian Application No. 102023000017769, filed on Aug. 29, 2023, which application is hereby incorporated herein by reference.

TECHNICAL FIELD

The embodiments of the present disclosure refer to memories, in particular row-decoders of memories, such as non-volatile memories, such as phase-change memories.

BACKGROUND

FIG. 1 shows a block diagram of a typical memory 20 comprising a memory area 200, which in turn comprises a plurality of memory cells CELL. For instance, frequently the memory cells CELL are arranged in a plurality of columns and rows.

For example, in Phase-Change Memories (PCM), each memory cell CELL is based upon alloys, for example chalcogenide alloys, e.g., GexSbyTz (more briefly referred to a GST alloys), which, following upon appropriate thermal treatments pass in a reversible way from an amorphous state with low electrical conductivity into a polycrystalline state with high conductivity. For example, in this context, United States Patent Application Nos. US 2019/0096480 A1, US 2019/0140175 A1, US 2019/0140176 A1 and US 2021/0012836 A1 may be cited, the contents of which are incorporated herein by reference.

Typically, the memory 20 receives at input an address signal ADR, where the address signal ADR is used to select a given memory sub-area within the memory area 200. For example, the address signal ADR may be supplied to a row decoder 202 (configured to select a word-line WL) and optionally a column decoder 204 (configured to select bit-line signal BL) in order to select a given memory sub-area in the memory area 200.

The memory 20 further comprises one or more input terminals and/or output terminals for exchanging a data signal DATA with the memory 20, where the data signal DATA may comprise data DATA_IN to be written and/or data DATA_OUT having been read. Typically, the selected sub-area of memory cells CELL has a number n of bits that corresponds to the number of bits of each of the signals DATA_IN and DATA_OUT. Accordingly, in case each row of the memory 20 has n bits, the column decoder 204 may be omitted and the row decoder 202 is sufficient in order to select a given sub-area in the memory area 200.

Often the address signal ADR is not directly supplied to the row decoder 202 and the optional column decoder 204, but the address signal ADR is stored in an address buffer 208. Similarly, also the data signal DATA may be stored in a data buffer 214.

Specifically, in the example considered, the memory 20 supports both read and write operations, which can be selected through a control signal W/R. For this purpose, the memory area 200 has associated a write and read interface 206. For instance, the interface 206 may comprise a write circuit 212 for writing the data DATA_IN in the selected memory sub-area, i.e., the selected memory cells CELL, and a read circuit 210, e.g., comprising a plurality of sense amplifier, for reading data DATA_OUT from the selected memory cells CELL.

For example, with reference to phase-change memories, the (considerable) difference in conductivity between the amorphous state and the polycrystalline state enables association of a binary datum to the state of the material of a cell CELL. For example, the state may be detected by measuring, via the measurement/read circuit 210, a parameter indicative of the electrical resistance of the material of the cell CELL. Conversely, in order to write information in a memory cell CELL, the writing circuit 212 is configured to selectively write/program the state (whether amorphous or polycrystalline) of the memory cell.

For example, as illustrated in FIG. 2A, to bring a memory cell CELL of the phase-change memory 20 into a first, low-conductivity, state (also identified as reset state), the write circuit 212 applies to the cell a current $I_{cell}=I_{reset}$ for a (short) time interval ΔT1, after which the current $I_{cell}$ is brought sharply to zero. In particular, this current $I_{cell}$ should be high enough to bring the material of the cell CELL to the melting point $T_{melt}$ of the cell CELL, thus causing melting of the material of the cell CELL. The fast cooling that follows then leaves the material in the amorphous state.

Instead, as shown in FIG. 2B, to bring a memory cell CELL from the first (reset) state to a second, high-conductivity, state (also identified as set state), the write circuit 212 applies to the cell a current $I_{cell}=I_{set}$, where $I_{set}<I_{Reset}$, for a (short) time interval ΔT2, wherein this current is subsequently reduced according to a ramp or in steps during a time interval ΔT3. In particular, this current $I_{cell}=I_{set}$ should be sufficient to reach the crystallization temperature $T_x$ of the cell CELL, with $T_x<T_{melt}$. The gradual cooling that is obtained in this case induces formation of crystals and hence the condition of high conductivity.

For instance, FIG. 3 shows a possible implementation of the memory 20. In particular, in the example considered, a single memory cell CELL is illustrated that is connected between a generic bit-line BLr and a generic word-line WLq. In particular, as mentioned previously, the cell CELL of a PCM 20 comprises a memory element GST, e.g., such as a chalcogenide alloy, connected between a bit-line BL and a word-line WL. As explained previously, in a memory 20, the address signal ADR is usually used to select via a row decoder 202 a given row of the memory area 200, and optionally via a column decoder 204 a given sub-set of the columns of the memory area 200. As mentioned before, the column decoder 204 is purely optional.

As explained with respect to FIGS. 2A and 2B, in order to program a given memory cell CELL of a PCM, the write circuit 212 should be configured to apply a given current $I_{cell}$ to the cell CELL. In the example considered, the write circuit 212 comprises for this purpose a plurality of n driver circuits 2126, so called programming drivers, wherein each driver circuit 2126 generates a respective current $I_{cell}$. Accordingly, the current $I_{cell}$ generated by a driver circuit 2126 may be applied to a given bit-line BL, or a demultiplexer 204 (implementing the column decoder) may be used to select, as a function of the address signal ADR, a given bit-line BL to which the current $I_{cell}$ is applied.

Conversely in order to generate the current flow through a specific cell CELL, the row decoder 202 drives the word-lines WL as a function of the address signal ADR. For example, in order to enable a current flow through the cell CELL shown in FIG. 3, the driver circuit 2126 (e.g., via the column decoder 204) applies the current $I_{cell}$ to the bit-line BLr and the row decoder 202 is configured to selectively connect the word-line WLq to ground. For example, in order to connect a given word-line WLq to ground, the row decoder 202 may comprise for each word-line WL a respective electronic switch MN1, such as a field-effect transistor (FET) MN1, such as a metal-oxide-semiconductor field-effect transistor (MOSFET), for example of an n-channel type, such as an NMOS transistor, wherein (the conduction path of) the electronic switch MN1 is connected between the respective word-line WL and ground, and wherein the control terminal (e.g., the gate terminal of a FET) is driven via a de-multiplexer 2020. Accordingly, the electronic switches MN1 and the de-multiplexer 2020 implement the row decoder 202.

Accordingly, in the example considered, the row decoder 202 and optionally the column decoder 204 select a given subset of n memory cells CELL and the driver circuits 2126 provide to each cell CELL of the selected cells a respective current $I_{cell}$. Specifically, by using for each selected cell a respective driver circuit 2126 (or alternatively by supplying the selected cells sequentially with one or more driver circuits 2126) each selected cell CELL may be supplied via a respective current $I_{cell}$. In the example considered, the driver circuits 2126 may thus receive one or more control signals CTRL that set the value of the current $I_{cell}$ supplied by the driver circuit 2126. For instance, using digital control signals, the driver circuit 2126 basically implements a current digital-to-analog converter (IDAC). In the example considered, the control signals CTRL are provided by a control circuit 2124 as a function of the (write/read) signal W/R and the corresponding data bit DATA_IN<n> to be written to the cell CELL. For example, in this way, the driver circuit 2126 may set the current $I_{cell}$ to the current $I_{reset}$ (e.g., W/R="1" and DATA_IN<n>="0") or the current $I_{set}$ (e.g., W/R="1" and DATA_IN<n>="1"). Moreover, the driver circuit 2126 may also be used by the read circuit 210 in order to set the current $I_{cell}$ to a further current adapted to perform a read operation (e.g., W/R="0"). For a more detailed description of such a PCM, reference can be made to document US 2021/012836 A1.

Similar memory interface circuits 212 are also used in other non-volatiles memories 20, wherein a memory cell CELL is programmed by applying a given current profile $I_{cell}$ to the memory cell CELL. For example, other types of such memories include Spin-Transfer Torque Magnetic Random-Access Memories (STT-MRAM, also called STT-RAM or sometimes ST-MRAM and ST-RAM) and Resistive Random-Access Memories (ReRAM or RRAM).

The driver circuits 2126 of such memories 20 are usually supplied with a higher supply voltage $V_{HV}$ compared to the supply voltage $V_{LV}$ used to supply the combinational and sequential logic circuits of the memory interface, such as the de-multiplexer 2020 for the word-lines WL. For example, usually this implies that the de-multiplexer 2020 cannot drive directly the FET MN1, but an additional level-conversion (in particular a level-elevator) circuit 2022 is required in order to convert the logic levels of the control signals generated by the de-multiplexer 2020 from the low voltage domain $V_{LV}$ to the high voltage domain $V_{HV}$. For example, in modern memories, the voltage $V_{LV}$ may be between 1 and 3 V, and the voltage $V_{HV}$ may be greater than 4 V.

SUMMARY

Various embodiments of the present disclosure provide improved solutions for such memories, in particular for implementing the row-decoder of such memories. According to one or more embodiments, the above object is achieved by a memory having the distinctive elements set forth specifically in the ensuing claims. Embodiments moreover concern a related integrated circuit.

The claims form an integral part of the technical teaching of the description provided herein.

As mentioned before, various embodiments of the present disclosure relate to a non-volatile memory. Specifically, the non-volatile memory comprises a memory area having a plurality of bit-lines and a plurality of word-lines. In various embodiments, in order to program the memory, the memory comprises a current source and a row decoder. Specifically, the current source is configured to provide a programming current to one or more of the bit-lines, wherein the current source is supplied via a first supply voltage. The row decoder is configured to connecting one of the word-lines to ground as a function of an address signal. For this purpose, the row decoder comprises a demultiplexer configured to provide for each word-line a respective enable signal, wherein the demultiplexer is configured to assert one of the enable signal as a function of the address signal.

Specifically, in various embodiments, the demultiplexer is supplied by a second supply voltage, whereby each enable signal is either connected to the second supply voltage or ground. Specifically, in various embodiments, the second supply voltage is smaller than the first supply voltage. For example, this permits that the demultiplexer and other digital circuits may use small FETs, which just have to support the second supply voltage. For example, in various embodiments, the first supply voltage is greater than 4 V, preferably between 5 and 6 V, and the second supply voltage is smaller than 3 V, preferably between 1 and 3 V.

However, this also implies that the row decoder should be able to support the first supply voltage, because the row decoder has to be able to connect the word-line to ground. Specifically, in various embodiments, the row decoder comprises for this purpose various FETs. However, as will be described in greater detail in the following, the solutions disclosed herein permit that the first supply voltage is greater than the gate-source and/or drain-source breakdown voltage of such FETs of the row decoder. For example, this permits that all FETs of the row decoder are implemented with the same production technology.

Specifically, in various embodiments, the non-volatile memory comprises for this purpose a power supply circuit configured to generate auxiliary voltages, in particular a first voltage and a second voltage, wherein the second voltage is smaller than the first voltage, wherein the first voltage corresponds to or is smaller than the first supply voltage, and wherein the second voltage corresponds to or is greater than the second supply voltage. For example, the second voltage may be selected between 40% and 60% of the value of the first supply voltage, preferably between 45% and 55%, preferably approximately 50%. Conversely, the first voltage may be selected between the first supply voltage and the value of the first supply voltage minus the gate-source threshold voltage of the FETs of the row decoder.

For example, in various embodiments, the power supply circuit may comprise three resistances connected in series between the first supply voltage and ground, wherein the second voltage corresponds to the voltage at the intermediate node between the second and third resistances and the first voltage corresponds to the voltage at the intermediate node between the first and second resistances.

Moreover, in various embodiments, the row decoder comprises for each word-line a charge circuit implemented via a pull-up connected between the respective word-line and the first supply voltage, and a discharge circuit. The pull-up may be an active or passive pull-up.

In various embodiments, the discharge circuit comprises a first and a second n-channel FET connected in series. Specifically, the source terminal of the first n-channel FET is connected to ground, and the gate terminal of the first n-channel FET is connected to a first signal. Moreover, the drain terminal of the second n-channel FET is connected to the respective word-line, the source terminal of the second n-channel FET is connected to a drain terminal of the first n-channel FET and the gate terminal of the second n-channel FET is connected to the second voltage.

Moreover, in various embodiments, the discharge circuit comprises a first p-channel FET, wherein the drain terminal of the first p-channel FET is connected to the second voltage, the source terminal of the first p-channel FET is connected to the respective word-line and the gate terminal of the first p-channel FET is connected to a second signal. Substantially, this p-channel FET is used to pre-discharge the word-line.

Finally, in various embodiments, the discharge circuit comprises a bias circuit configured to set the voltage at the drain terminal of the first n-channel FET to the second voltage when the first n-channel FET and the second n-channel FET are opened. For example, in various embodiments, the bias circuit comprises a third n-channel FET, wherein the source terminal of the third n-channel FET is connected to the drain terminal of the first n-channel FET, the drain terminal of the third n-channel FET is connected to the second voltage and the gate terminal of the third n-channel FET is connected to the respective word-line.

Moreover, the row decoder comprises circuits for driving the first n-channel FET via the first signal and the first p-channel FET via the second signal. Specifically, in various embodiments, the row decoder comprises for this purpose a first delay circuit and a second delay circuit.

Specifically, the first delay circuit is configured to detect changes in the enable signal. In response to detecting a change from an asserted logic level to a de-asserted logic level of the enable signal, the first delay circuit connects the first signal to ground. Conversely, in response to detecting a change from a de-asserted logic level to an asserted logic level of the enable signal, the first delay circuit sets the first signal after a first delay to a voltage in order to close the first FET. For example, in various embodiments, the first delay circuit is configured to close the first FET by setting the first signal to the second voltage. In various embodiments, the enable signal is asserted when the enable signal is connected to the first supply voltage.

For example, in order to implement such an asymmetric delay, the first delay circuit comprises a first capacitance having a first terminal connected to ground and a second terminal connected via a fourth resistance to the second voltage, and a fourth n-channel FET configured to selectively short-circuit the capacitance as a function of the enable signal.

Conversely, the second delay circuit is configured to detect changes in the enable signal. In response to detecting a change from a de-asserted logic level to an asserted logic level of the enable signal, the second delay circuit sets the second signal to the second voltage. Conversely, in response to detecting a change from an asserted logic level to a de-asserted logic level of the enable signal, the second delay circuit sets the second signal after a second delay to the first voltage. For example, the second delay circuit may comprise a second capacitance having a first terminal connected to the second voltage and a second terminal connected via a fifth resistance to the first voltage, and fifth n-channel FET configured to selectively short-circuit the capacitance as a function of the enable signal.

In various embodiments, the second delay circuit comprises also a level shifter circuit configured to generate a level shifted version of the enable signal, wherein the level shifted version is either set to the first voltage or the second voltage.

BRIEF DESCRIPTION OF THE DRAWINGS

The embodiments of the present disclosure will now be described with reference to the annexed drawings, which are provided purely by way of non-limiting example and in which.

DETAILED DESCRIPTION OF ILLUSTRATIVE EMBODIMENTS

In the ensuing description, various specific details are illustrated aimed at providing an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment", and the like, that may be present in various points of this description do not necessarily refer to one and the same embodiment. Moreover, particular conformations, structures, or characteristics may be combined in any adequate way in one or more embodiments.

The references used herein are provided only for convenience and hence do not define the sphere of protection or the scope of the embodiments.

Figure 1:
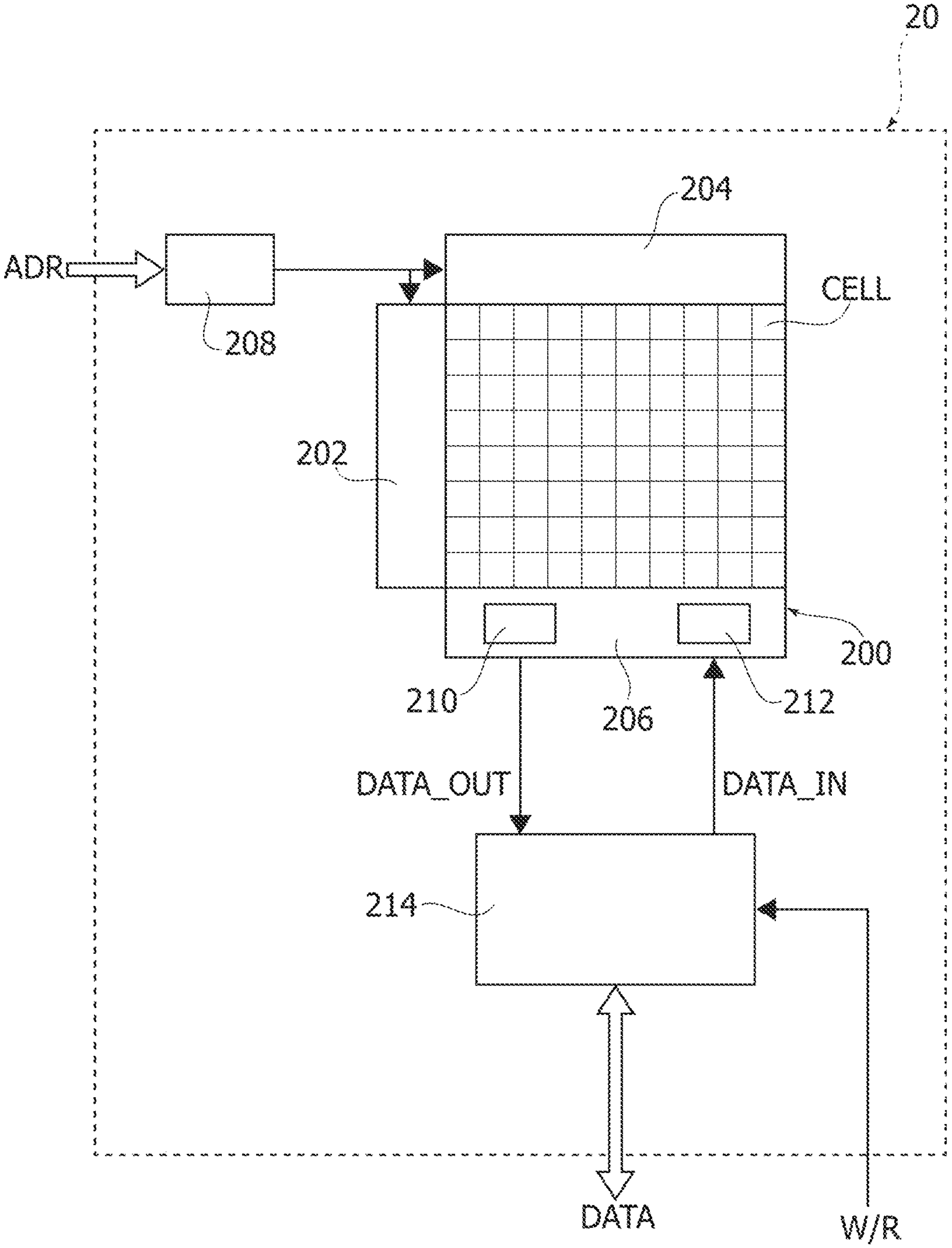
FIG. 1 shows an example of a memory comprising a plurality of memory cells.
Figure 2A:
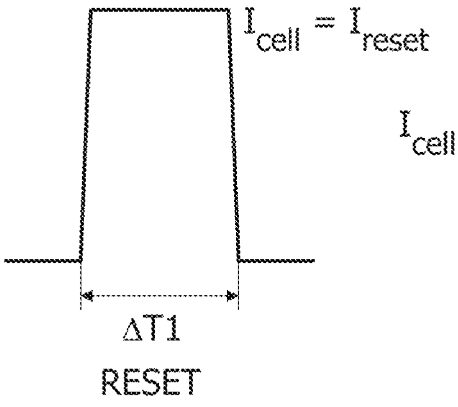
FIGS. 2A and 2B show examples for carrying out a reset and a set of a memory cell.
Figure 2B:
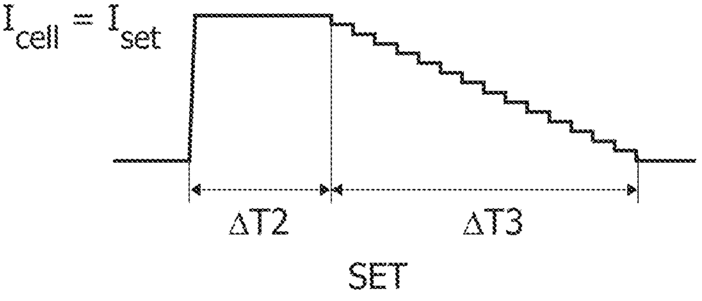
Figure 3:
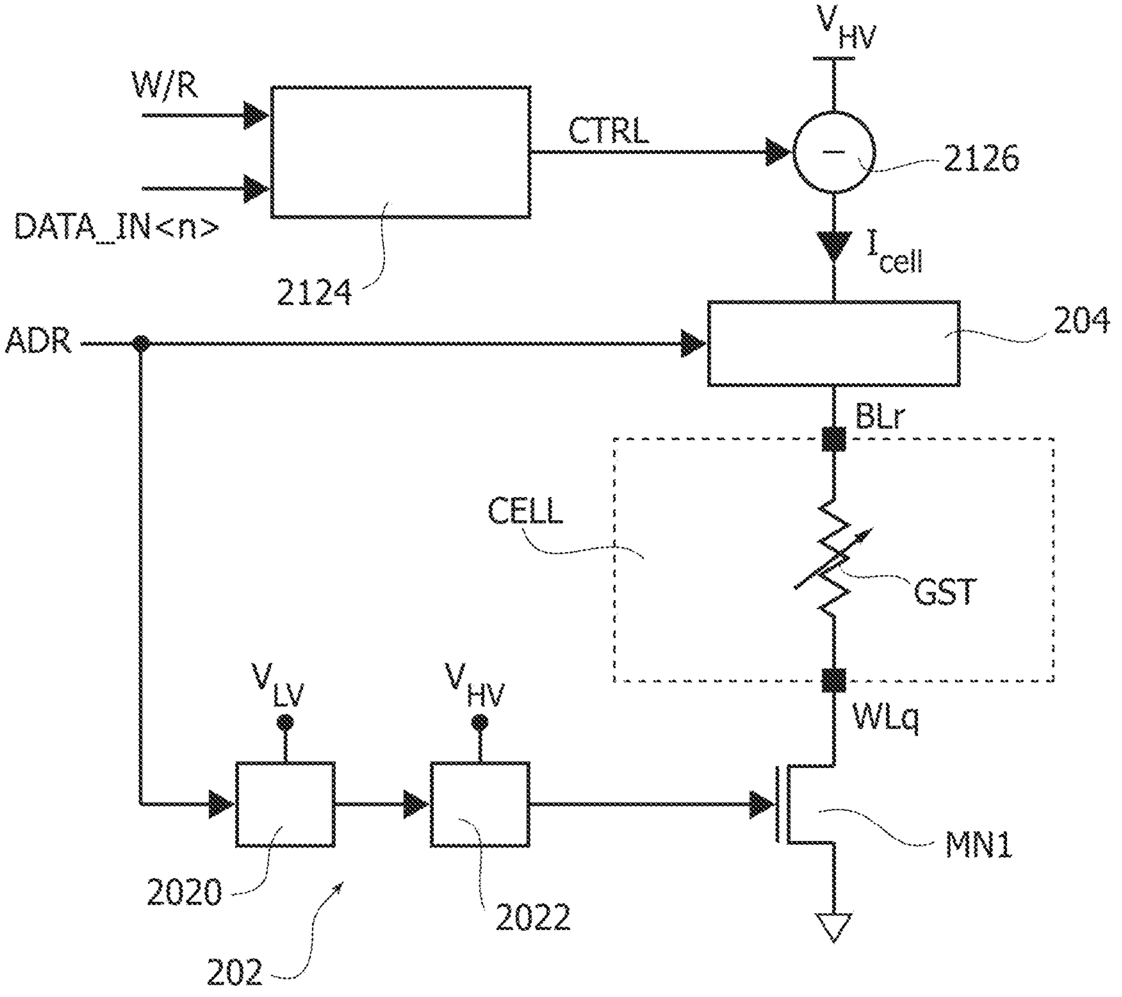
FIG. 3 shows an example of a write interface of the memory of FIG. 1.

In FIGS. 4 to 11 described hereinafter, parts, elements, or components that have already been described with reference to FIGS. 1 to 3 are designated by the same references previously used in these figures. The description of these elements presented previously will not be repeated in what follows in order not to overburden the present detailed description.

As described with respect to FIG. 3, usually the row decoder of a non-volatile memory, in particular in case of a non-volatile memory using a programming current $I_{cell}$, such as a PCM, STT-MRAM or ReRAM, the row decoder 202 comprises for each word-line WL a respective FET MN1 and a de-multiplexer 2020 configured to drive the FETs MN1 in order to close one of the FETs MN1 as a function of the (e.g., buffered) address signal ADR, thereby connecting one of the word-lines WL to ground. Moreover, the driver circuit(s) 2126 are usually supplied with a higher supply voltage $V_{HV}$ compared to the supply voltage $V_{LV}$ of the de-multiplexer 2020 for the word-lines WL.

Accordingly, while the de-multiplexer 2020 may use a first type of FETs which supports a maximum voltage of $V_{LV}$, the level-conversion circuit 2022 and the FET MN1 have to use a second type of FETs which supports a maximum voltage of $V_{HV}$. However, the implementation of such different FETs supporting different maximum voltages within the same integrated circuit may be complex. For example, in order to support a higher gate-source voltage, the gate-oxide of the second type of FETs has to be thicker than the gate-oxide of the first type of FETs. However, this implies that the gate-oxide of both types of FETs cannot be realized during the same process step, but additional steps are required to implement the thicker gate-oxide of the second type of FETs.

Accordingly, in order to reduce the costs, also the FETs of the combinational and logic circuits, such as the de-multiplexer 2020 may be implemented with the second type of FETs, also using the supply voltage $V_{HV}$. However, this generates additional electric losses.

Figure 4:
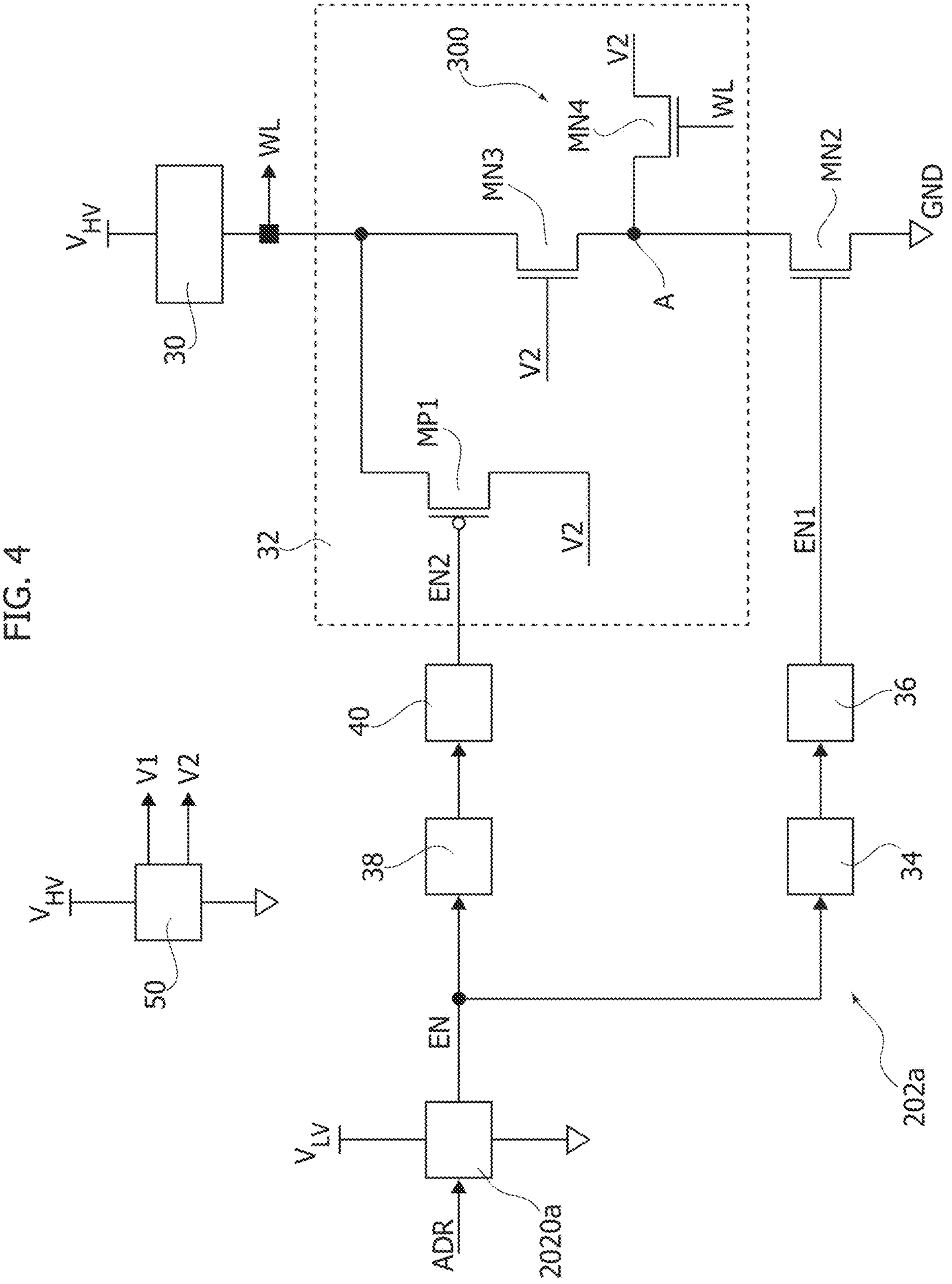
FIG. 4 shows an embodiment of a row-decoder according to the present disclosure.

FIG. 4 shows instead an embodiment of a row-decoder 202*a*, wherein each FET MN1 is replaced with a respective switching circuit, wherein each switching circuit may just comprise low-power FETs. Specifically, in various embodiments, these low-power FETs are configured to support a maximum gate-source voltage and a maximum drain-source voltage of $V_{LV}$, but not $V_{HV}$. For example, this implies that the low-power FETs are damaged when the gate-source voltage of the drain-source voltage reaches the voltage $V_{HV}$.

Specifically, also the row decoder 202*a* comprise a demultiplexer 2020*a* configured to generate a plurality of enable signal EN, wherein each enable signal EN is associated with a respective word-line WL. In line with the previous description, the demultiplexer 2020*a* is configured to assert one of the enable signals EN as a function of the address signal ADR. For example, in various embodiments, an enable signal EN is asserted by setting the enable signal EN to high. However, in other embodiments, an enable signal EN is asserted by setting the enable signal EN to low.

Accordingly, in the embodiment considered, when the enable signal EN is asserted/set to a first logic level, the respective word-line WL should be connected to ground GND, and when the enable signal EN is de-asserted/set to a second logic level, the respective word-line WL should be connected to the voltage $V_{HV}$, which is used to supply the driver circuit/current generator 2126 (see also the description of FIG. 3).

Specifically, in the embodiment considered, the word-line WL is connected via a pull-up 30 to the voltage $V_{HV}$. In general, the pull-up may be a passive pull-up, such as a pull-up resistance, e.g., resistor, or an active pull-up, which may be controlled, e.g., by the enable signal. For example, an active pull-up may be enabled when the respective enable signal EN is de-asserted/set to a second logic level.

Conversely, in order to connect the word-line WL to ground GND, the row decoder 202*a* comprises a n-channel FET MN2, such as a NMOS, and an additional switching circuit 32. Specifically, the source terminal of the FET MN2 is connected (e.g., directly) to ground GND, and the drain terminal of the FET MN2 represents a node A connected via the switching circuit 32 to the word-line WL.

As mentioned in the foregoing, the FETs of the row decoder 202*a* may be unable to support the voltage $V_{HV}$. Accordingly, in various embodiments, in order to enable the word-line WL, i.e., connect the word-line to ground GND, the circuit 32 is configured to first discharge the word-line to a voltage being lower than the maximum drain-source voltage supported by the FET MN2. Next, the FET MN2 is closed in order to connect (short-circuit) the word-line WL to ground GND.

Specifically, in the embodiment considered, the circuit 32 comprises:

- a p-channel FET MP1, such as a PMOS, wherein the source terminal of the FET MP1 is connected (e.g., directly) to the word-line WL, the drain terminal of the FET MP1 is connected (e.g., directly) to a voltage V2 and the gate terminal of the FET MP1 is driven via a signal EN2;
- an n-channel FET MN3, such as a NMOS, wherein the drain terminal of the FET MN3 is connected (e.g., directly) to the word-line WL, the source terminal of the FET MN3 is connected (e.g., directly) to the drain terminal of the FET MN2 (node A) and the gate terminal of the FET MN3 is connected (e.g., directly) to the voltage V2.

Accordingly, in the embodiment considered, when the FET MP1 is closed, the word-line WL is connected to the voltage V2. For example, in various embodiments, the voltage V2 is selected between 40% and 60% of $V_{HV}$, preferably between 45% and 55%, preferably 50%. Accordingly, in order to correctly drive the FET MP1, the signal EN2 should be set:

- in order to open the FET MP1, to a voltage V1, wherein the value V1 is selected between $V_{HV}$ and $V_{HV}$ minus the gate-source threshold voltage of the FET MP1;
- in order to close the FET MP1 and permit a discharge of the word-line WL, to the voltage V2.

For example, in various embodiments, the voltage $V_{HV}$ is greater than 4 V and, e.g., selected in a range between 5 and 6 V, e.g., approximately 5 V, and the voltage V2 corresponds to 50% of $V_{HV}$, e.g., approximately 2.5 V. In this case, the voltage V1 may be selected in a range between 5 V and approximately 4.4, and may correspond, e.g., to 4.5 V.

Figure 6:
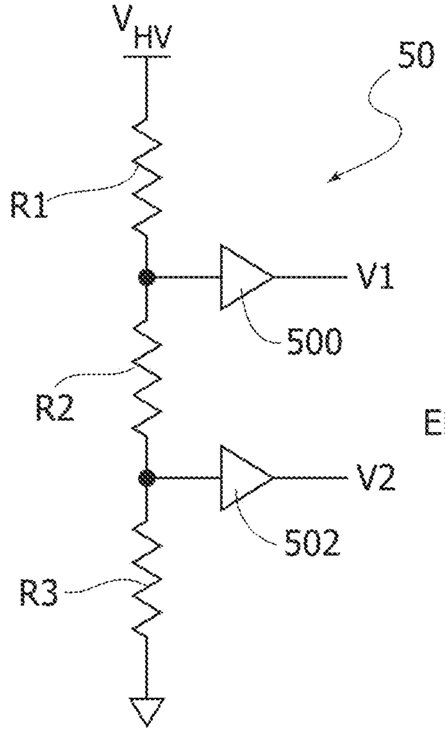
FIG. 6 shows an embodiment of a voltage supply circuit of the row decoder of FIG. 4.

For example, FIG. 6 shows an embodiment of a power supply circuit 50 configured to generate the voltages V1 and V2 based on the voltage $V_{HV}$.

Specifically, in the embodiment considered, the voltage V2 is generated via a voltage divider and a voltage buffer 502, such as a voltage follower. Conversely, the voltage V1 may correspond to the voltage $V_{HV}$ or may also be generated via a voltage divider and a voltage buffer 500, such as a voltage follower. For example, in FIG. 6, the voltage generator 50 comprises three resistances R1, R2 and R3 connected in series between the voltage $V_{HV}$ and ground, wherein the voltage V2 corresponds (via the buffer 502) to the voltage at the intermediate node between the resistances R2 and R3 and the voltage V1 corresponds (via the buffer 500) to the voltage at the intermediate node between the resistances R1 and R2.

In the embodiment considered, the circuit 32 comprises also a bias circuit 300 configured to prevent that the node A remains floating when the FETs MN2 and MN3 are opened. Specifically, in various embodiments, the bias circuit is configured to couple the node A to the voltage V2 when the FETs MN2 and MN3 are opened, thereby also limiting the drain-source voltages of the FETs MN2 and MN3. In general, the bias circuit 300 may be a passive bias circuit or an active bias circuit.

Specifically, concerning an active bias circuit, the FET MN3 is closed when the gate-source voltage of the FET MN3 (i.e., the voltage difference between the voltage V2 and the voltage at the node A) is greater than the threshold voltage of the FET MN3. In this respect, when the FET MN2 is opened (the signal EN1 is low), the FET MN3 is automatically opened, when the voltage at the node A exceeds the voltage V2 minus the threshold voltage of the FET MN3.

Accordingly, in various embodiments, an active bias circuit 300 may detect implicitly that the FETs MN2 and MN3 are opened by determining that the voltage $V_{WL}$ exceeds the voltage V2. For example, in the embodiment considered, the bias circuit 300 comprises a n-channel FET MN4, such as a NMOS, wherein the source terminal of the FET MN4 is connected (e.g., directly) to the drain terminal of the FET MN2 (node A), the drain terminal of the FET MN4 is connected (e.g., directly) to the voltage V2 and the gate terminal of the FET MN4 is connected (e.g., directly) to the word-line WL.

Conversely, a passive bias circuit may be implemented by replacing the FET MN4 with a resistance, such as a resistor, connected between the node A and the voltage V2, wherein the resistance has preferably a large resistance value.

Figure 5:
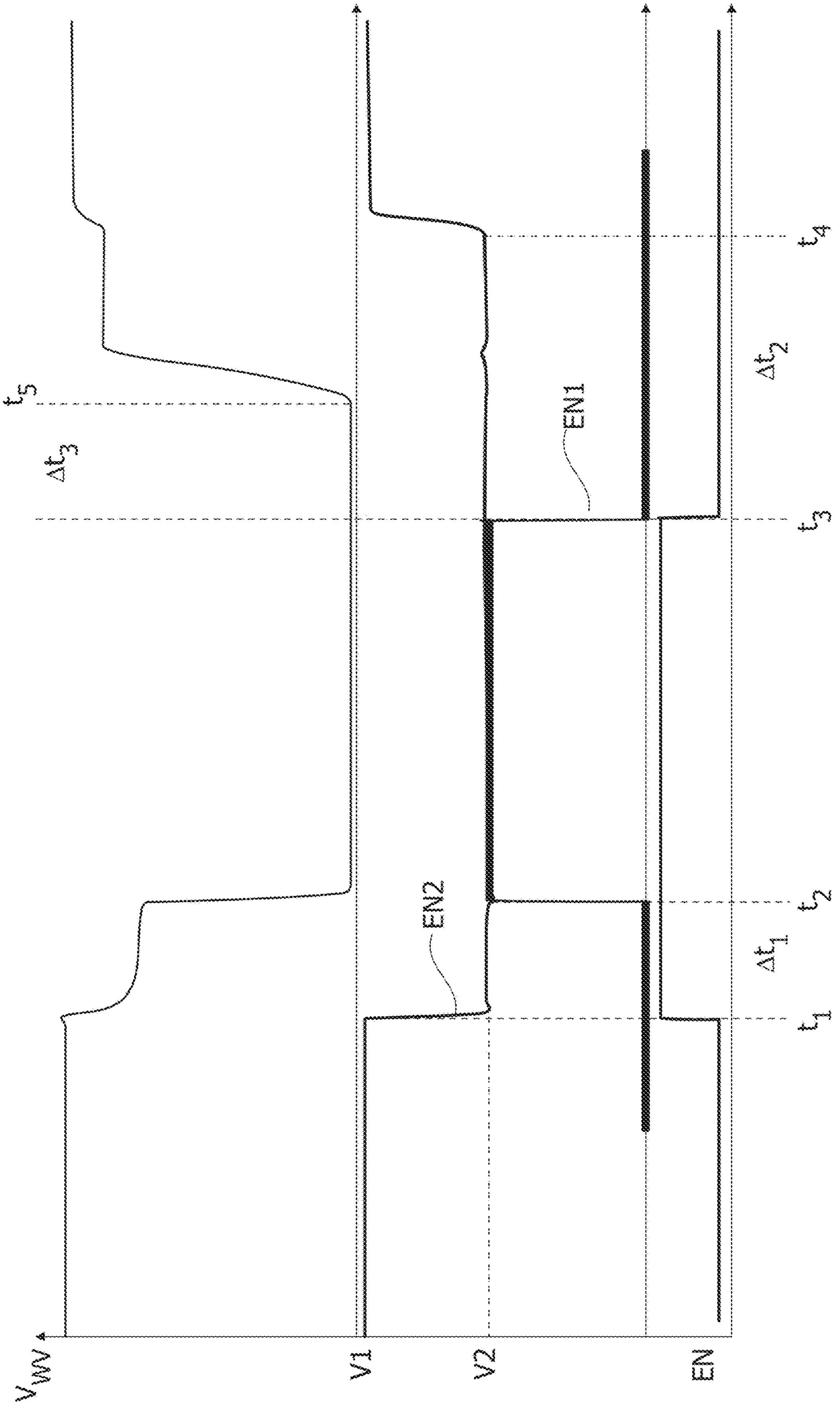
FIG. 5 shows an embodiment of the operation of the row decoder of FIG. 4.

Accordingly, as shown in FIG. 5, in various embodiments, the enable signal EN is initially de-asserted, e.g., set to low. In this condition, the row decoder 202*a* is configured to:

set the signal EN2 to the voltage V1, whereby the p-channel FET MP1 is opened; and set the signal EN1 to ground GND, whereby the n-channel FET MN2 is opened.

In this condition, as will be described in the following, the FET MN3 is opened and the node A is set to the voltage V2 via the bias circuit 300. For example, in the embodiment considered, the FET MN4 is closed, because the voltage $V_{WL}$ at the word-line WL is greater than the voltage V2, whereby the node A is connected to the voltage V2. Accordingly, in the embodiment considered, the drain-source voltage of the FETs MP1 and MN3 is $V_{WL}$-V2, and of the FET MN2 V2.

At an instant $t_1$ the demultiplexer 2020*a* asserts the enable signal EN, e.g., in response to a write request to the respective address ADR. Once the enable signal EN is asserted at the instant $t_1$, the row decoder 202*a* is configured to:

set the signal EN2 to the voltage V2, whereby the p-channel FET MP1 is closed; and set the signal EN1 to ground GND, thereby maintaining opening the n-channel FET MN2.

Accordingly, in this way, the word-line WL discharges to the voltage V2, until the voltage $V_{WL}$ reaches the voltage V2 plus the gate-source threshold voltage of the FET MP1. For example, when using a voltage V2 of 2.5 V, the word-line WL discharges approximately to 3.2 V (assuming a gate-source threshold voltage of 0.7 V).

In this condition an active bias circuit 300 may also be disabled. For example, in the embodiment considered, the FET MN4 is opened when the voltage $V_{WL}$ falls below the voltage V2 plus the threshold voltage of the FET MN4.

Accordingly, in the embodiment considered, the pre-discharged word-line WL may now be discharged completely and it is sufficient that the FETs are able to support the residual voltage, i.e., voltage V2 plus the gate-source threshold voltage of the FET MP1. For example, in the embodiment considered, after a time $\Delta t_1$ with respect to the instant $t_1$, the row-decoder 202*a* is configured to:

set the signal EN2 to the voltage V2; and set the signal EN1 to a voltage in order to close the n-channel FET MN2, such as the voltage V2.

In this condition, the FET MP1 remains opened. Conversely, the FET MN3 remains closed because the gate-source voltage of the FET MN3 is above the threshold voltage of the FET MN3 (i.e., the gate-source voltage of the FET MN3 is approximately V2). Accordingly, in this way, the word-line WL is connected via the FETs MN2 and MN3 to ground GND.

In this condition, an active bias circuit 300 may remain disabled. For example, the FET MN4 remains opened because the gate-source voltage of the FET MN4 is below the threshold voltage of the FET MN4.

The FETs MN2, MN3 and MP1 may also be used to gradually increase the voltage $V_{WL}$ of the word-line. Specifically, once the demultiplexer 2020*a* de-asserts the enable signal EN at an instant $t_3$, the row-decoder 202*a* is configured to:

set the signal EN2 to the voltage V2; and set the signal EN1 to ground GND, thereby opening the n-channel FET MN2.

Accordingly, at an instant $t_5$, the voltage $V_{WL}$ at the word-line WL increases due to the pull-up 30. Specifically, due to this increasing voltage $V_{WL}$ the FET MN3 is opened when the voltage at the node A reaches the voltage V2 minus the gate-source threshold voltage of the FET MN3. Moreover, since the gate terminal of the FET MP1 is connected to the voltage V2, the FET MP1 limits the voltage $V_{WL}$ to the voltage V2 plus the gate-source threshold voltage of the FET MP1.

In general, the instant $t_5$ may correspond to the instant $t_3$, or the instant $t_5$ may start after a delay $\Delta t_3$. For example, when using a passive pull-up 30, the voltage $V_{WL}$ increases immediately, once the FET MN2 is opened (i.e., $t_5=t_3$).

Conversely, when using an active pull-up 30, the row-decoder 202*a* may be configured to de-activate the pull-up at the instant $t_1$ when the enable signal EN is asserted or after a given delay with respect to the instant $t_1$ when the enable signal EN is asserted. In a complementary manner, the row-decoder 202*a* may be configured to activate the pull-up 30 at the instant $t_3$ when the enable signal EN is de-asserted or after a given delay $\Delta t_3$ with respect to the instant when the enable signal EN is de-asserted. In general, the delay $\Delta t_3$ may also just derive from propagation delays for activating the pull-up at the instant $t_3$.

Accordingly, in the embodiment considered, after a delay $\Delta t_2$ with respect to the instant $t_3$, with $\Delta t_2 > \Delta t_3$, the row decoder 202*a* is configured to:

set the signal EN2 to the voltage V1; and set the signal EN1 to ground GND.

Accordingly, in this condition, the FET MP1 is opened and the word-line WL is charged via the pull-up 30 to the maximum voltage. Substantially, the maximum voltage at the word-line is defined via the pull-up 30.

As mentioned before, the bias circuit 300 should apply a bias voltage to the node A when the FETs MN2 and MN3 are opened. For example, in the embodiment considered, the FET MN4 connects the node A to the voltage V2 once the voltage $V_{WL}$ reaches the voltage V2 plus the gate-source threshold voltage of the FET MN4.

Accordingly, as shown in FIG. 4, in order to generate the delayed signals EN1 and EN2 used to drive the FETs MN2 and MP1, respectively, the row-decoder 202*a* may comprise for each signal a respective delay circuit 36 and 40. Moreover, the enable signal EN2 has associated a level-conversion circuit 38 (in particular a level shifter). Optionally, also the enable signal EN1 may have associated a level-conversion circuit 34. In general, the level-conversion may be performed before (as shown in FIG. 4) or after the delay operation. In various embodiments, the level-conversion circuit may be integrated in the respective delay circuit.

Figure 7:
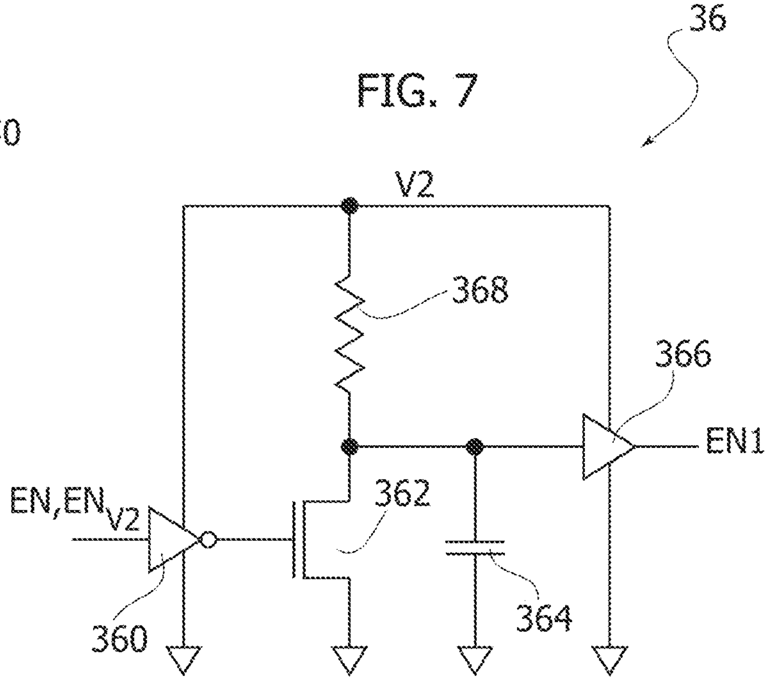
FIG. 7 shows an embodiment of a first delay circuit of the row decoder of FIG. 4.

For example, FIG. 7 shows an embodiment of the delay circuit 36. Specifically, as shown in FIG. 5, the delay circuit 36 is configured to:

- in response to detecting that the enable signal EN changes from de-asserted to asserted, e.g., in response to a rising edge of the signal EN, set the signal EN1 after a delay $\Delta t_1$ to high;
- in response to detecting that the enable signal EN changes from asserted to de-asserted, e.g., in response to a falling edge of the signal EN, set the signal EN1 immediately (or after a brief delay being an order of magnitude smaller than the delay $\Delta t_1$) to low.

For example, in the embodiment considered, the different delay is introduced via a delay circuit 36 comprising a capacitance 364, wherein a first terminal is connected via a resistance 368 to a supply voltage and the second terminal is connected to ground, and an n-channel FET 362, such as an NMOS, wherein the drain terminal is connected to the first terminal of the capacitance (intermediate node between the capacitance 364 and the resistance 368) and the source terminal is connected to ground.

Accordingly, the capacitance 364 is gradually charged via the resistance 368 when the FET 362 is opened, and the capacitance 364 is discharged (almost instantaneously) when the FET 362 is closed.

Accordingly, in the embodiment considered, the circuit 36 comprises a comparator 366, such as a comparator with hysteresis, e.g., implemented with an even number of inverters (not gates), configured to set the signal EN1 to high when the voltage at the capacitance 364 is greater than a first threshold and to low when the voltage at the capacitance 364 is smaller than a second threshold, which may also correspond to the first threshold.

Accordingly, when the enable signal EN (or a level converted version $EN_{V2}$ thereof) is asserted by setting the signal to high, the level of the gate voltage of the FET 362 is inverted. Accordingly, in the embodiment considered, the delay circuit 36 comprises an inverter 360 configured to drive the gate terminal of the FET 362 with the inverted version of the signal EN. In general, based on the logic level of the signal EN, the inverter 360 may also be omitted or be implemented in the level conversion circuit 34.

In case the delay circuit 36 drives directly the FET MN2, the comparator circuit 366 is supplied by the voltage V2, whereby the comparator 366 generates a signal being set either to V2 or ground. In various embodiments, also the resistance 368 and the optional inverter 360 are supplied by the voltage V2.

Figure 8A:
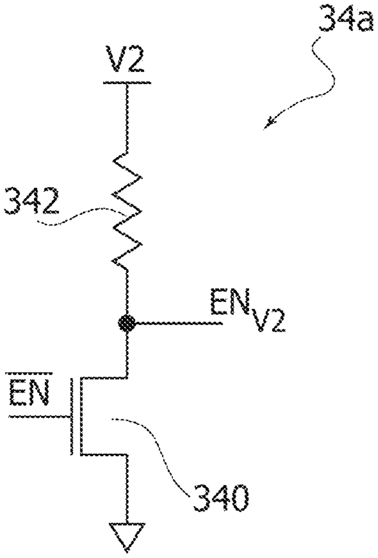
FIGS. 8A and 8B show embodiments of a first level conversion circuit of the row decoder of FIG. 4.

FIG. 8A shows a first embodiment of a level conversion circuit 34*a*, which may be used, e.g., when the voltage $V_{LV}$ (used for the signal EN) is smaller than the voltage V2.

For example, in FIG. 8A, the level conversion circuit 34*a* comprises a n-channel FET 340, wherein the drain terminal is connected via a pull-up resistance 342 to the supply voltage V2 and the source terminal is connected to ground. Accordingly, by driving the gate terminal of the FET 340 with the inverted version of the signal EN, the drain terminal of the FET 340 provides a level converted version $EN_{V2}$ of the signal EN, which is set to V2 or ground.

Figure 8B:
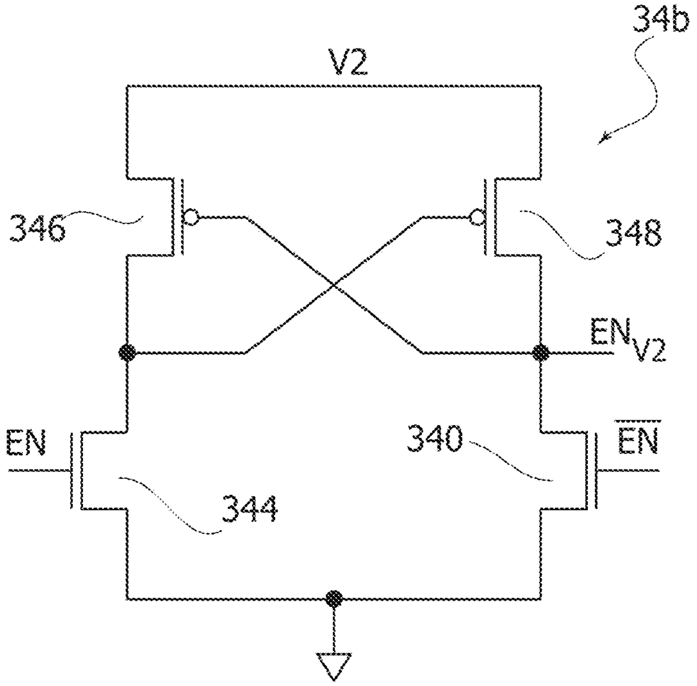

FIG. 8B shows a second embodiment of a level conversion circuit 34*b*, wherein the resistance 342 has been replaced with a p-channel FET 348.

Specifically, in the embodiment considered, the source terminal of the FET 340 is connected to ground, the drain terminal of the FET 340 is connected to the drain terminal of the FET 348 and the source terminal of the FET 348 is connected to the supply voltage V2. Moreover, the source terminal of a further n-channel FET 344 is connected to ground GND, the drain terminal of the further FET 344 is connected to the drain terminal of a further p-channel FET 346 and the source terminal of the further p-channel FET 346 is connected to the supply voltage V2. Finally, the gate terminal of the FET 348 is connected to the drain terminal of the FET 344 (intermediate node between the FETs 344 and 346) and the gate terminal of the FET 346 is connected to the drain terminal of the FET 340 (intermediate node between the FETs 340 and 348). Accordingly, by driving the gate terminal of the FET 344 with the signal EN and the gate terminal of the FET 340 with the inverted version of the signal EN, the drain terminal of the FET 340 provides again a level converted version $EN_{V2}$ of the signal EN, which is set to V2 or ground GND.

A similar level conversion circuit 34*a* or 34*b* may thus also be provided at the output of the delay circuit 36 in case the delay circuit 36 is supplied with the voltage $V_{LV}$.

Figure 9:
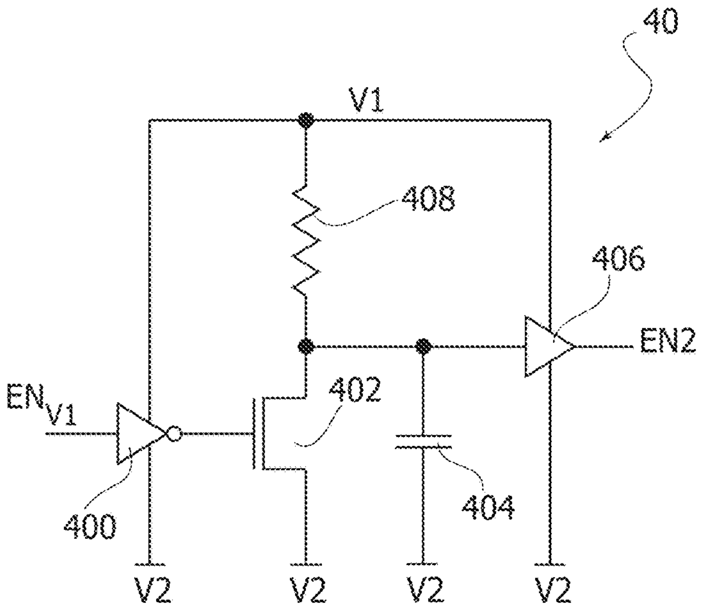
FIG. 9 shows an embodiment of a second delay circuit of the row decoder of FIG. 4.

FIG. 9 shows an embodiment of the delay circuit 40. Specifically, as shown in FIG. 5, the delay circuit 36 is configured to:

- in response to detecting that the enable signal EN changes from asserted to de-asserted, e.g., in response to a falling edge of the signal EN, set the signal EN2 after a delay $\Delta t_2$ to high;
- in response to detecting that the enable signal EN changes from de-asserted to asserted, e.g., in response to a rising edge of the signal EN, set the signal EN2 immediately (or after a brief delay being an order of magnitude smaller than the delay $\Delta t_2$) to low.

For example, in the embodiment considered, the circuit 40 receives already a signal $EN_{V1}$ corresponding to a level shifted and inverted version of the signal EN. Accordingly, similar to the delay circuit 36, the delay circuit 40 may comprise:

- a capacitance 404, wherein a first terminal is connected via a resistance 408 to the voltage V1 and the second terminal is connected to the voltage V2, which thus represent a shifted ground, and an n-channel FET 402, such as an NMOS, wherein the drain terminal is connected to the first terminal of the capacitance 404 (intermediate node between the capacitance 404 and the resistance 408) and the source terminal is connected to the voltage V2;
- a comparator 406 such as a comparator with hysteresis, e.g., implemented with an even number of inverters (not gates), configured to set the signal EN2 to V1 (high) when the voltage at the capacitance 404 is greater than a first threshold and to V2 (low) when the voltage at the capacitance 404 is smaller than a second threshold, which may also correspond to the first threshold, wherein the comparator 406 is supplied by the voltage V1 and referred to the voltage V2;

a further inverter 400 driving the gate terminal of the FET 402 based on the signal $EN_{V1}$.

In general, the inverter 400 may also be omitted when the signal $EN_{V1}$ corresponds only to a level shifted version of the signal EN, or the inverter 400 may be implemented in the level conversion circuit 38.

Figure 10:
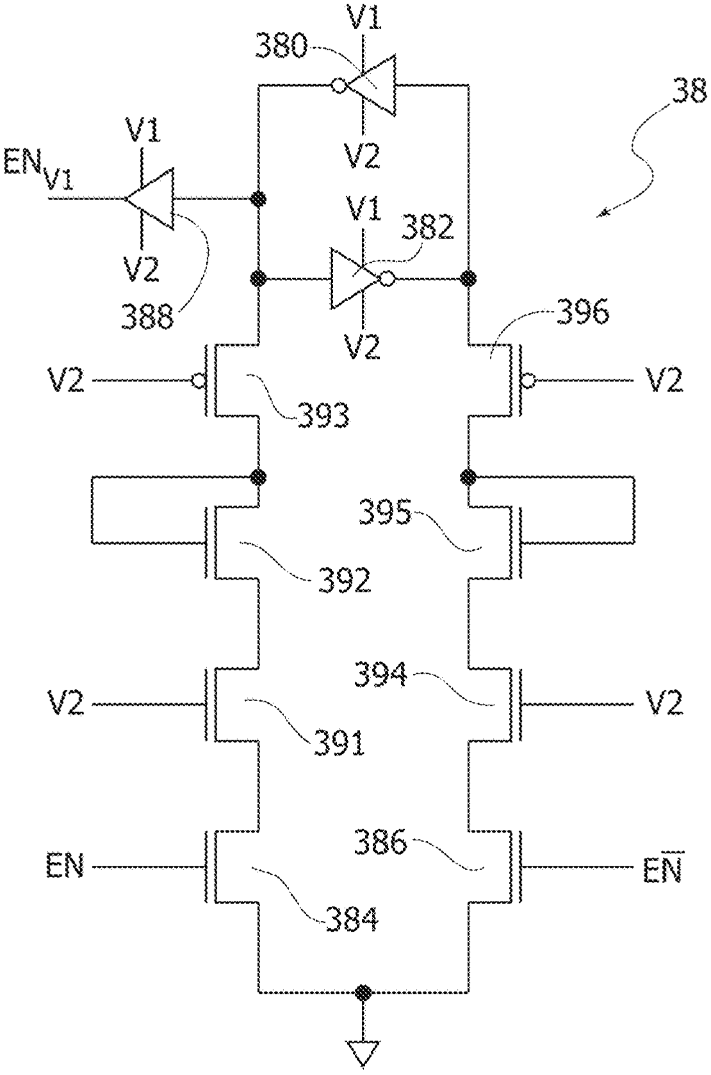
FIG. 10 shows an embodiments of a second level conversion circuit of the row decoder of FIG. 4.

FIG. 10 shows an embodiment of the level shifter 38. Specifically, since the level shifter 38 operates with the voltage V2, this level shifter should ensure that the voltages at the FETs does not exceed the permitted maximum voltage.

Specifically, for this purpose, the level shifter 38 comprises an even number of inverter stages, such as two inverters 380 and 382, connected to form a ring, wherein these inverters are supplied by the voltage V1 and referred to the voltage V2. Accordingly, the output of a last inverter, e.g., inverter 380, may be set to V1 (high) by setting the input of the inverter 380 or an even inverter to low. Conversely, the output of a last inverter, e.g., inverter 380, may be set to V2 (low) by setting the input of an odd inverter, e.g., inverter 382, to low.

Specifically, in the embodiment considered, the input of the inverter 382 is connected to a low voltage via a n-channel FET 384 and a first voltage limiter circuit. Specifically, in the embodiment considered, the source terminal of the FET 384 is connected to ground, the drain terminal is connected via the first voltage limiter circuit to the input of the inverter 382, and the gate terminal of the FET 384 is connected to the enable signal EN. In this respect, the first voltage limiter circuit is configured to limit the voltage at the input of the inverter 382 and the drain-source voltage of the FET 384 (when the FET 384 is opened).

For example, in the embodiment considered, the first voltage limiter circuit comprises p-channel FET 393 and two n-channel FETs 392 and 391, wherein:

- the source terminal of the FET 393 is connected to the input of the inverter 382, the drain terminal of the FET 393 is connected to the drain terminal of the FET 392, and the gate terminal of the FET 393 is connected to the voltage V2;
- the gate terminal of the FET 392 is connected to the drain terminal of the FET 392; and
- the source terminal of the FET 391 is connected to the drain terminal of the FET 384, the drain terminal of the FET 391 is connected to the source terminal of the FET 392, and the gate terminal of the FET 391 is connected to the voltage V2.

Substantially, the p-channel FET 393 implements a cascode limiting the voltage at the input of the inverter 382 to a minimum value correspond to the voltage V2 plus the gate-source threshold voltage of the FET 393. Conversely, the n-channel FET 391 implements a cascode limiting the voltage at the drain terminal of the FET 384. Finally, the FET 392 essentially implements a diode used to reduce the voltage. Generally, based on the specific voltage levels, the FET 392 is purely optional and may be omitted or replaced with a plurality of series connected FET, each configured as diode.

Similarly, in the embodiment considered, the input of the inverter 380 is connected to a low voltage via a n-channel FET 386 and a second voltage limiter circuit. Specifically, in the embodiment considered, the source terminal of the FET 386 is connected to ground, the drain terminal is connected via the second voltage limiter circuit to the input of the inverter 380, and the gate terminal of the FET 386 is connected to the inverted version of the enable signal EN. In this respect, the second voltage limiter circuit is configured to limit the voltage at the input of the inverter 380 and the drain-source voltage of the FET 386 (when the FET 386 is opened).

For example, in the embodiment considered, the second voltage limiter circuit comprises p-channel FET 396 and two n-channel FETs 394 and 395, wherein:

- the source terminal of the FET 396 is connected to the input of the inverter 380, the drain terminal of the FET 396 is connected to the drain terminal of the FET 395, and the gate terminal of the FET 396 is connected to the voltage V2;
- the gate terminal of the FET 395 is connected to the drain terminal of the FET 395; and
- the source terminal of the FET 394 is connected to the drain terminal of the FET 386, the drain terminal of the FET 394 is connected to the source terminal of the FET 395, and the gate terminal of the FET 394 is connected to the voltage V2.

Accordingly, in this case, the p-channel FET 396 implements a cascode limiting the voltage at the input of the inverter 380 to a minimum value. Conversely, the n-channel FET 394 implements a cascode limiting the voltage at the drain terminal of the FET 386. Finally, the FET 395 essentially implements a diode used to reduce the voltage. Also the FET 395 may be omitted or replaced with a plurality of series connected FET, each configured as diode.

Accordingly, when driving the FET 384 with the enable signal EN and the FET 386 with the inverted version of the enable signal EN, the output of the last inverter of the ring, e.g., inverter 380, provides already an inverted and level shifted version $EN_{V1}$ of the signal EN. Optionally, the signal $EN_{V1}$ may also be generated via a comparator 388 such as a comparator with hysteresis, e.g., implemented with an even number of inverters (not gates), configured to set the signal $EN_{V1}$ to V1 (high) when the voltage at the output of the inverter 380 is greater than a first threshold and to V2 (low) when the voltage at the output of the inverter 380 is smaller than a second threshold, which may also correspond to the first threshold.

Accordingly, the solutions disclosed herein ensure that the gate-source and drain-source voltages of the various FETs of the row-decoder 202*a* do not exceed a maximum voltage, which is at most the voltage V2 plus the gate-source threshold voltage of the p-channel FET MP1, whereby the maximum permitted voltage may be smaller than the voltage $V_{HV}$.

Figure 11:
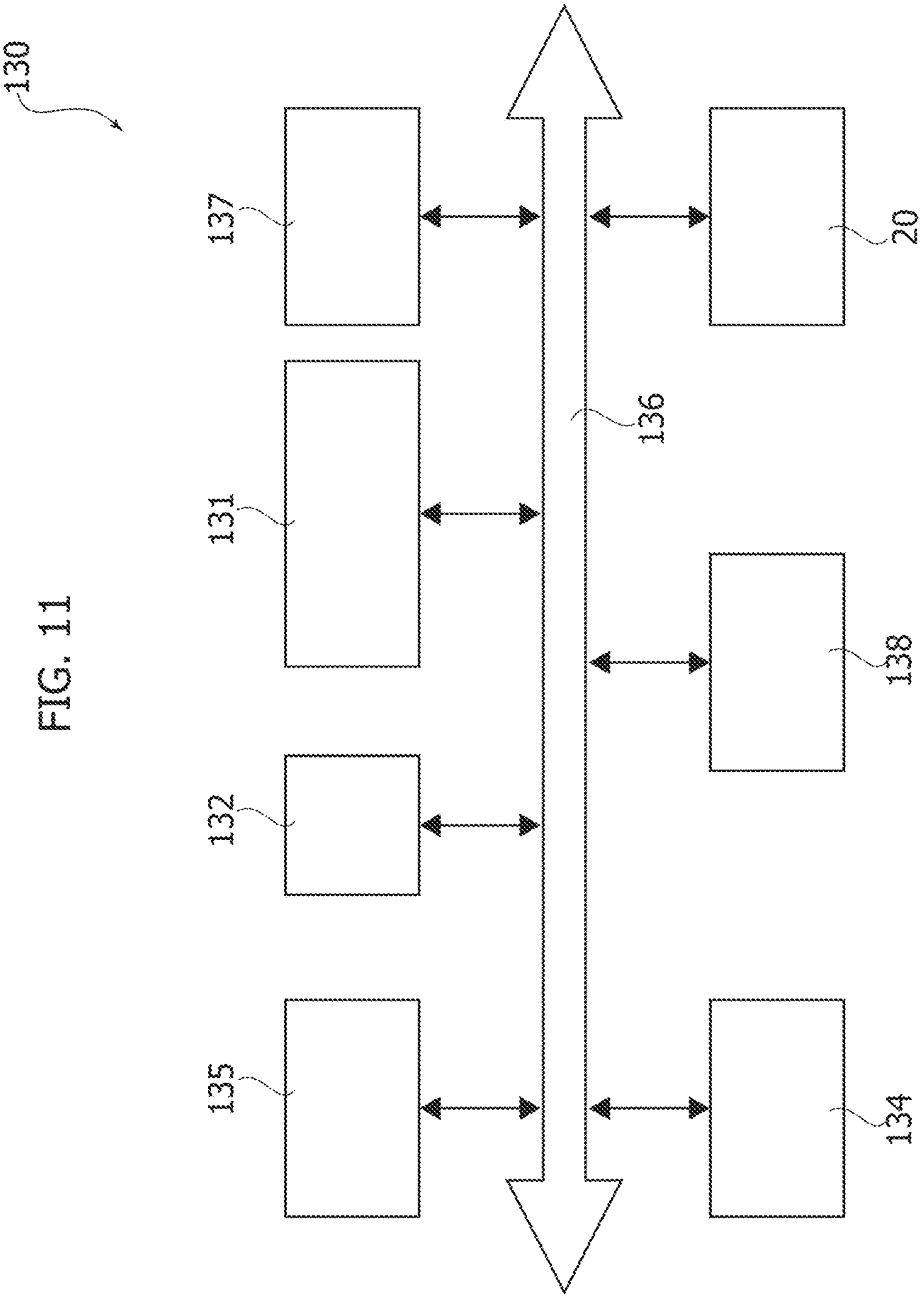
FIG. 11 shows an embodiment of a system comprising a memory according to the present disclosure.

FIG. 11 shows a part of an electronic system 130 according to the present disclosure. The electronic system 130 can be used in electronic devices, such as: a PDA (Personal Digital Assistant); a portable or fixed computer, possibly with wireless data-transfer capacity; a mobile phone; a digital audio player; a photographic camera or video camera; or other devices that are able to process, store, transmit, and receive information.

In particular, the electronic system 130 comprises the (non-volatile) memory 20 described in the foregoing and a processor or processing unit 131 (for example, equipped with microprocessor, DSP, or microcontroller), which are both coupled to a bus 136 designed for exchanging data with the memory 20. Consequently, the processor or processing unit 131 can generate the signals ADR and DATA_IN described previously.

Moreover, the electronic system 130 may optionally comprise, coupled to the bus 136, one or more of the following elements:

- an input/output device 132 (for example, equipped with keypad and display) for input and display of the data;

a wireless interface 134, for example an antenna, for transmitting and receiving data through a radiofrequency wireless-communication network;

a RAM 135;

a battery 137, which can be used as electrical supply source in the electronic system 130; i.e., the battery 137 can be used to generate the supply voltages $V_{LV}$ and/or $V_{HV}$; and a camera 138.

In various embodiments, the processor or processing unit 131 may be connected to the memory 20 through a dedicated connection different from, and possibly additional to, the bus 136 (the latter may hence be present or absent).

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. A non-volatile memory comprising:

a memory area having a plurality of bit-lines and a plurality of word-lines;

a current source configured to provide a programming current to one or more of the bit-lines, wherein the current source is supplied via a first supply voltage;

a power supply circuit configured to generate a first voltage and a second voltage, wherein the second voltage is smaller than the first voltage, wherein the first voltage corresponds to or is smaller than the first supply voltage, and wherein the second voltage corresponds to or is greater than a second supply voltage; and a row decoder configured to connect one of the word-lines to ground as a first function of an address signal, and comprising a demultiplexer configured to provide enable signals, a respective enable signal for each word-line, and to assert one of the enable signals as a second function of the address signal, wherein the demultiplexer is supplied by the second supply voltage, wherein each enable signal is connected to either the second supply voltage or the ground, wherein the second supply voltage is smaller than the first supply voltage, and wherein the row decoder comprises for each word-line:

a pull-up connected between the respective word-line and the first supply voltage;

a first n-channel field-effect transistor (FET), wherein a source terminal of the first n-channel FET is connected to the ground, and a gate terminal of the first n-channel FET is connected to a first signal;

a second n-channel FET, wherein a drain terminal of the second n-channel FET is connected to the respective word-line, a source terminal of the second n-channel FET is connected to a drain terminal of the first n-channel FET, and a gate terminal of the second n-channel FET is connected to the second voltage;

a first p-channel FET, wherein a drain terminal of the first p-channel FET is connected to the second voltage, a source terminal of the first p-channel FET is connected to the respective word-line, and a gate terminal of the first p-channel FET is connected to a second signal;

a bias circuit configured to set a drain voltage at the drain terminal of the first n-channel FET to the second voltage when the first n-channel FET and the second n-channel FET are opened;

a first delay circuit configured to:

detect changes in the respective enable signal;

in response to detecting a change from an asserted logic level to a de-asserted logic level of the respective enable signal, connect the first signal to the ground; and in response to detecting a change from the de-asserted logic level to the asserted logic level of the respective enable signal, set the first signal after a first delay to a voltage in order to close the first FET; and a second delay circuit configured to:

detect the changes in the respective enable signal;

in response to detecting the change from the de-asserted logic level to the asserted logic level of the respective enable signal, set the second signal to the second voltage; and in response to detecting the change from the asserted logic level to the de-asserted logic level of the respective enable signal, set the second signal after a second delay to the first voltage.

2. The memory according to claim 1, wherein the first supply voltage is greater than a gate-source and/or drain-source breakdown voltage of the FETs.

3. The memory according to claim 1, wherein the second voltage is selected between 40% and 60% of the first supply voltage.

4. The memory according to claim 1, wherein the first voltage is selected between the first supply voltage, and the first supply voltage minus a gate-source threshold voltage of the first p-channel FET.

5. The memory according to claim 1, wherein the first supply voltage is greater than 4 V, and wherein the second supply voltage is smaller than 3 V.

6. The memory according to claim 1, wherein the bias circuit comprises:

a third n-channel FET, wherein a source terminal of the third n-channel FET is connected to the drain terminal of the first n-channel FET, a drain terminal of the third n-channel FET is connected to the second voltage, and a gate terminal of the third n-channel FET is connected to the respective word-line.

7. The memory according to claim 1, wherein the power supply circuit comprises first, second and third resistances connected in series between the first supply voltage and the ground, wherein the second voltage corresponds to a first node voltage at a first intermediate node between the second and third resistances, and the first voltage corresponds to a second node voltage at a second intermediate node between the first and second resistances.

8. The memory according to claim 1, wherein the respective enable signal is asserted when the respective enable signal is connected to the first supply voltage.

9. The memory according to claim 1, wherein the first delay circuit is configured to close the first FET by setting the first signal to the second voltage.

10. The memory according to claim 9, wherein the first delay circuit comprises:

a first capacitance having a first terminal connected to the ground, and a second terminal connected via a fourth resistance to the second voltage; and a fourth n-channel FET configured to selectively short-circuit the first capacitance as a function of the respective enable signal.

11. The memory according to claim 10, wherein the second delay circuit comprises:
  a second capacitance having a first terminal connected to the second voltage, and a second terminal connected via a fifth resistance to the first voltage; and
  a fifth n-channel FET configured to selectively short-circuit the second capacitance as a function of the respective enable signal.

12. The memory according to claim 1, wherein the second delay circuit comprises:
  a level shifter circuit configured to generate a level shifted version of the respective enable signal, wherein the level shifted version of the respective enable signal is set to either the first voltage or the second voltage.

13. The memory according to claim 1, wherein the memory is disposed on an integrated circuit.

14. An electronic system comprising:
  a processor configured to generate an address signal; and
  a non-volatile memory operatively coupled to the processor and comprising:
    a memory area having a plurality of bit-lines and a plurality of word-lines;
    a current source configured to provide a programming current to one or more of the bit-lines, wherein the current source is supplied via a first supply voltage;
    a power supply circuit configured to generate a first voltage and a second voltage, wherein the second voltage is smaller than the first voltage, wherein the first voltage corresponds to or is smaller than the first supply voltage, and wherein the second voltage corresponds to or is greater than a second supply voltage; and
    a row decoder configured to connect one of the word-lines to ground as a first function of the address signal, and comprising a demultiplexer configured to provide enable signals, a respective enable signal for each word-line, and to assert one of the enable signals as a second function of the address signal, wherein the demultiplexer is supplied by the second supply voltage, wherein each enable signal is connected to either the second supply voltage or the ground, wherein the second supply voltage is smaller than the first supply voltage, and wherein the row decoder comprises for each word-line:
      a pull-up connected between the respective word-line and the first supply voltage;
      a first n-channel field-effect transistor (FET), wherein a source terminal of the first n-channel FET is connected to the ground, and a gate terminal of the first n-channel FET is connected to a first signal;
      a second n-channel FET, wherein a drain terminal of the second n-channel FET is connected to the respective word-line, a source terminal of the second n-channel FET is connected to a drain terminal of the first n-channel FET, and a gate terminal of the second n-channel FET is connected to the second voltage;
      a first p-channel FET, wherein a drain terminal of the first p-channel FET is connected to the second voltage, a source terminal of the first p-channel FET is connected to the respective word-line, and a gate terminal of the first p-channel FET is connected to a second signal;
      a bias circuit configured to set a drain voltage at the drain terminal of the first n-channel FET to the second voltage when the first n-channel FET and the second n-channel FET are opened;
    a first delay circuit configured to:
      detect changes in the respective enable signal;
      in response to detecting a change from an asserted logic level to a de-asserted logic level of the respective enable signal, connect the first signal to the ground; and
      in response to detecting a change from the de-asserted logic level to the asserted logic level of the respective enable signal, set the first signal after a first delay to a voltage in order to close the first FET; and
    a second delay circuit configured to:
      detect the changes in the respective enable signal;
      in response to detecting the change from the de-asserted logic level to the asserted logic level of the respective enable signal, set the second signal to the second voltage; and
      in response to detecting the change from the asserted logic level to the de-asserted logic level of the respective enable signal, set the second signal after a second delay to the first voltage.

15. A method of operating a non-volatile memory, the non-volatile memory comprising a memory area having a plurality of bit-lines and a plurality of word-lines, a current source being supplied via a first supply voltage, a power supply circuit configured to generate a first voltage and a second voltage, the second voltage being smaller than the first voltage, the first voltage corresponding to or being smaller than the first supply voltage, and the second voltage corresponding to or being greater than a second supply voltage, and a row decoder comprising a demultiplexer configured to provide enable signals, a respective enable signal for each word-line, and to assert one of the enable signals as a first function of an address signal, the demultiplexer being supplied by the second supply voltage, each enable signal being connected to either the second supply voltage or ground, and the row decoder comprising, for each word-line, a pull-up connected between the respective word-line and the first supply voltage, a first n-channel field-effect transistor (FET), a source terminal of the first n-channel FET being connected to the ground, and a gate terminal of the first n-channel FET is connected to a first signal, a second n-channel FET, a drain terminal of the second n-channel FET being connected to the respective word-line, a source terminal of the second n-channel FET is connected to a drain terminal of the first n-channel FET, and a gate terminal of the second n-channel FET is connected to the second voltage, a first p-channel FET, a drain terminal of the first p-channel FET being connected to the second voltage, a source terminal of the first p-channel FET is connected to the respective word-line, and a gate terminal of the first p-channel FET is connected to a second signal, a bias circuit, a first delay circuit, and a second delay circuit, the method comprising:
  providing the first supply voltage and the second supply voltage to the non-volatile memory, the second supply voltage being smaller than the first supply voltage; and
  providing the address signal to the row decoder.

16. The method of claim 15, further comprising, in response to detecting a change from an asserted logic level to a de-asserted logic level of the respective enable signal:
  connecting, by the first delay circuit, the first signal to the ground; and
  setting, by the second delay circuit, the second signal after a second delay to the first voltage.

17. The method of claim 15, further comprising, in response to detecting a change from a de-asserted logic level to an asserted logic level of the respective enable signal:

setting, by the first delay circuit, the first signal after a first delay to the first voltage in order to close the first FET; and setting, by the second delay circuit, the second signal to the second voltage.

18. The method of claim 15, further comprising setting, by the bias circuit, a drain voltage at the drain terminal of the first n-channel FET to the second voltage in response to the first n-channel FET and the second n-channel FET being open.

19. The method of claim 15, further comprising:

connecting, by the row decoder, one of the word-lines to the ground as a second function of the address signal;

providing, by the demultiplexer, the respective enable signal to the one of the word-lines; and providing, by the current source, a programming current to one or more of the bit-lines.

20. The method of claim 15, further comprising:

closing, by the first delay circuit, the first FET by setting the first signal to the second voltage;

selectively short-circuiting, by a fourth n-channel FET of the first delay circuit, a first capacitance of the first delay circuit as a first function of the respective enable signal, a first terminal of the first capacitance connected to the ground, and a second terminal of the first capacitance connected via a fourth resistance to the second voltage; and selectively short-circuiting, by a fifth n-channel FET of the second delay circuit, a second capacitance of the second delay circuit as a second function of the respective enable signal, a first terminal of the second capacitance connected to the second voltage, and a second terminal of the second capacitance connected via a fifth resistance to the first voltage.

* * * * *